(12) United States Patent
Yamamoto et al.

(10) Patent No.: US 8,133,412 B2
(45) Date of Patent: Mar. 13, 2012

(54) ANISOTROPIC CONDUCTIVE FILM

(75) Inventors: Masamichi Yamamoto, Osaka (JP); Yasuhiro Okuda, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 55 days.

(21) Appl. No.: 12/918,731

(22) PCT Filed: Sep. 18, 2009

(86) PCT No.: PCT/JP2009/066382
§ 371 (c)(1), (2), (4) Date: Aug. 20, 2010

(87) PCT Pub. No.: WO2010/047200
PCT Pub. Date: Apr. 29, 2010

(65) Prior Publication Data
US 2010/0327232 A1 Dec. 30, 2010

(30) Foreign Application Priority Data
Oct. 21, 2008 (JP) .................... 2008-271106

(51) Int. Cl.
*H01B 1/00* (2006.01)
*B32B 7/12* (2006.01)
*C08L 29/04* (2006.01)

(52) U.S. Cl. .......... 252/500; 428/356; 524/503
(58) Field of Classification Search ............. 252/500; 428/356; 524/503
See application file for complete search history.

(56) References Cited

FOREIGN PATENT DOCUMENTS

| JP | 05-117419 | 5/1993 |
|---|---|---|
| JP | 2007-217503 | 8/2007 |
| JP | 2007-232627 | 9/2007 |
| JP | 2008-094908 | 4/2008 |

*Primary Examiner* — Mark Kopec
*Assistant Examiner* — Jaison Thomas
(74) *Attorney, Agent, or Firm* — McDermott Will & Emery LLP

(57) ABSTRACT

An anisotropic conductive film 2 contains electrically conductive particles 6 dispersed in an adhesive agent 30 for electrode connection, the adhesive agent containing an epoxy resin, which is an insulating thermosetting resin, as a main component, a phenoxy resin having a molecular weight of 30,000 or more, a latent hardener, a polyvinyl butyral resin having a glass-transition temperature of 100° C. or higher, and a polyvinyl butyral resin having a glass-transition temperature of 90° C. or lower. There is provided the high-heat-resistant anisotropic conductive film which suppresses a reduction in repairability and which can be used for electrodes having a finer pitch, i.e., having a minimum pitch of 150 μm or less, when electrodes are connected with the anisotropic conductive film.

8 Claims, 1 Drawing Sheet

ANISOTROPIC CONDUCTIVE FILM

RELATED APPLICATIONS

This application is the U.S. National Phase under 35 U.S.C. §371 of International Application No. PCT/JP2009/066382, filed on Sep. 18, 2009, which in turn claims the benefit of Japanese Application No. 2008-271106, filed on Oct. 21, 2008, the disclosures of which Applications are incorporated by reference herein.

TECHNICAL FIELD

The present invention relates to an anisotropic conductive film configured to bond and electrically connect a wiring board or an electronic component provided with an electrode, a circuit, and so forth.

BACKGROUND ART

In recent years, there have been advances in a reduction in the size of connection terminals in component parts (for example, electronic components in liquid crystal products) due to a trend toward miniaturization and higher functions of electronic devices. Thus, in the field of electronics packaging, anisotropic conductive films, which are film-shaped adhesive agents, are widely used as various adhesive agents for electrode connection, the adhesive agents being capable of easily establishing connections between such terminals. For example, they are used for connections between a flexible printed wiring board (flexible printed circuit board (FPC)) provided with metal electrodes composed of gold-plated copper electrodes and a glass board provided with wiring electrodes composed of indium tin oxide (ITO) electrodes or a rigid board (printed circuit board (PCB)) provided with wiring electrodes composed of gold-plated copper electrodes on a rigid base material such as a glass epoxy base material, between an electronic component such as an integrated circuit (IC) chip and a rigid board, between a flexible board and a printed wiring board, and between flexible boards.

The anisotropic conductive film serves as, for example, an adhesive agent containing electrically conductive particles dispersed in an insulating thermosetting resin such as an epoxy resin. The anisotropic conductive film is sandwiched between connection targets and heated and pressurized to bond the connection targets. That is, the resin in the adhesive agent flows by heating and pressurization, so that, for example, a gap between copper electrodes arranged on a flexible printed wiring board and indium tin oxide (ITO) electrodes arranged on a surface of a wiring board is sealed, and electrical connection between the copper electrodes and the ITO electrodes is established through some electrically conductive particles.

Furthermore, the anisotropic conductive film is required to have electric conduction performance that reduces resistance (connection resistance or resistance to conduction) between connected electrodes facing each other in the thickness direction of the anisotropic conductive film, and to have insulation performance that increases resistance (insulation resistance) between adjacent electrodes in the planar direction of the anisotropic conductive film. In general, for example, a film containing a thermosetting resin such as an epoxy resin as a main component, electrically conductive particles composed of gold, silver, zinc, tin, solder, indium, or palladium, and a microencapsulated latent hardener is disclosed as an anisotropic conductive film having such performance.

For the case of producing the adhesive agent for electrode connection, in general, electrically conductive particles are first added to a solution of an insulating thermosetting resin, e.g., an epoxy resin as a main component dissolved in a predetermined solvent, preparing a composite material for an adhesive agent. Next, the composite material is agitated to uniformly disperse the electrically conductive particles. The composite material is applied onto a film that has been subjected to release treatment, dried, and solidified, thereby providing the adhesive agent for electrode connection.

Here, from the viewpoint that operations (hereinafter, referred to as "repair") can be easily performed, the operations including peeling the connected electrodes from each other without breakage or damage, removing the adhesive agent with, for example, a solvent, and then connecting the electrodes to each other with the adhesive agent again, it is generally known that a polyvinyl butyral resin, which is a thermoplastic resin, is added when the adhesive agent is prepared. The polyvinyl butyral resin is a solid at room temperature. The polyvinyl butyral resin is softened by heating at a glass-transition temperature (e.g., 60° C.) and can easily be processed. Thus, even if a bonded article of, for example, a flexible printed wiring board and a wiring board is a failure component due to displacement, the wiring board and so forth of the bonded article can be peeled off without damage by heating the polyvinyl butyral resin-containing adhesive agent for electrode connection to a glass-transition temperature. The peeled flexible printed wiring board, the wiring board, and so forth can be used again as component parts of electronic devices.

However, the polyvinyl butyral resin is softened in an environment at a temperature of the glass-transition temperature or higher, thus increasing the mobility of impurity ions in the adhesive agent for electrode connection and reducing the insulation of the adhesive agent for electrode connection. In the case where a current flows continuously between electrodes a bonded article of, for example, a flexible printed wiring board and a wiring board in this state, disadvantageously, insulation failure (i.e., electromigration) due to the migration of metal atoms occurs easily. A higher polyvinyl butyral resin content results in a reduction in insulation. A lower polyvinyl butyral resin content results in a reduction in repairability. Thus, it is disadvantageously difficult to strike a balance between improvement in the insulation of the adhesive agent and improvement in repairability.

Furthermore, in the case where heating is performed to bond, for example, a flexible printed wiring board and a wiring board, the polyvinyl butyral resin in the adhesive agent for electrode connection is softened into a rubber state. So, in the case where pressurization to bond, for example, a flexible printed wiring board and a wiring board is released while the polyvinyl butyral resin is in the rubber state, faulty connections occur because of resilience present in the adhesive agent for electrode connection. It is thus necessary to release the pressurization after the polyvinyl butyral resin is changed into a glass state by cooling the heated adhesive agent for electrode connection to a glass-transition temperature or lower. Hence, in the case where a glass-transition temperature is low, a time period for mounting is disadvantageously increased by the time it takes to release pressurization.

An adhesive agent for electrode connection is disclosed, the adhesive agent containing a thermosetting resin as a main component, a latent hardener, a polyvinyl butyral resin, and electrically conductive particles, in which the thermosetting resin contains a naphthalene-type epoxy resin, and a cured material composed of the thermosetting resin has a glass-transition temperature of 90° C. or higher, the glass-transition temperature being measured by dynamic viscoelasticity measurement (dynamic mechanical analysis (DMA)) (for example, see Patent Literature 1). It is described that the adhesive agent for electrode connection can strike a balance between insulation and repairability and that in the case where, for example, a flexible printed wiring board is mounted on a wiring board, it is possible to reduce a time period for mounting. It is believed that the use of the adhesive agent for electrode connection provides an anisotropic conductive film that strikes a balance between insulation and repairability.

SUMMARY OF INVENTION

Technical Problem

The use of an anisotropic conductive film containing the adhesive agent for electrode connection described in Patent Literature 1 makes it possible to assuredly connect electrodes arranged at a fine pitch (electrodes with a minimum pitch of 200 µm or less) on a flexible printed wiring board or a rigid board and maintain insulation resistance between adjacent electrodes. However, in recent years, trends toward a finer pitch have required a flexible printed wiring board or a rigid board having electrodes with a minimum pitch of 150 µm or less. For electrodes having a minimum pitch of 150 µm or less, the distance between adjacent electrodes in the planar direction is reduced compared with the case of a minimum pitch of 200 µm or less, so that high insulation performance is required. Thus, even in the case of the anisotropic conductive film containing the adhesive agent for electrode connection described in Patent Literature 1, the cured material composed of the thermosetting resin having a glass-transition temperature of 90° C. or higher, it is difficult to maintain insulation reliability between adjacent electrodes in the planar direction.

Meanwhile, in an anisotropic conductive film using an adhesive agent, containing a thermosetting resin having a simply increased glass-transition temperature, for electrode connection, the ease of repair described above (hereinafter, referred to as "repairability") is disadvantageously reduced.

The present invention has been made in light of the foregoing problems. It is an object of the present invention to provide a high-heat-resistant anisotropic conductive film which suppresses a reduction in repairability and which can be used for electrodes having a finer pitch, i.e., having a minimum pitch of 150 µm or less when electrodes are connected with the anisotropic conductive film.

Solution to Problem

An anisotropic conductive film according to the present invention contains a thermosetting resin as a main component, a phenoxy resin having a molecular weight of 30,000 or more, a latent hardener, a polyvinyl butyral resin, and electrically conductive particles. Furthermore, the polyvinyl butyral resin contains a polyvinyl butyral resin having a glass-transition temperature of 100° C. or higher and a polyvinyl butyral resin having a glass-transition temperature of 90° C. or lower.

According to this configuration, the anisotropic conductive film contains the polyvinyl butyral resin having a glass-transition temperature of 90° C. or lower. It is thus possible to easily soften the polyvinyl butyral resin by heating, thereby maintaining repairability at a satisfactory level. Meanwhile, the anisotropic conductive film contains the polyvinyl butyral resin having a glass-transition temperature of 100° C. or higher, thereby improving the heat resistance of the anisotropic conductive film. Thus, the anisotropic conductive film can be used for electrodes having a finer pitch, i.e., having a minimum pitch of 150 µm or less.

In the anisotropic conductive film according to the present invention, the proportion of the polyvinyl butyral resin having a glass-transition temperature of 100° C. or higher is preferably in the range of 10% by mass to 90% by mass with respect to the total mass of all polyvinyl butyral resins contained.

According to this configuration, a proportion of the polyvinyl butyral resin having a glass-transition temperature of 100° C. or higher of 10% by mass or more with respect to the total mass of all polyvinyl butyral resins results in improvement in the heat resistance of the anisotropic conductive film compared with the case of less than 10% by mass, so that the film can be used for electrodes having a finer pitch, i.e., having a minimum pitch of 150 µm or less. Furthermore, a proportion of the polyvinyl butyral resin having a glass-transition temperature of 100° C. or higher of 90% by mass or less with respect to the total mass of all polyvinyl butyral resins facilitates the softening of the polyvinyl butyral resin by heating, as compared with the case of more than 90% by mass, thus maintaining repairability at a satisfactorily level.

In the anisotropic conductive film according to the present invention, the total proportion of the polyvinyl butyral resins is preferably in the range of 5% by mass to 35% by mass with respect to the total mass of the anisotropic conductive film.

According to this configuration, the total proportion of the polyvinyl butyral resins is 5% by mass or more with respect to the total mass of the anisotropic conductive film, thus more easily ensuring repairability. The total proportion of the polyvinyl butyral resins is 35% by mass or less with respect to the total mass of the anisotropic conductive film, thus easily providing insulation.

In the anisotropic conductive film according to the present invention, preferably, the polyvinyl butyral resin with a glass-transition temperature of 100° C. or higher has a molecular weight of 20,000 to 150,000, and the polyvinyl butyral resin with a glass-transition temperature of 90° C. or lower has a molecular weight of 10,000 to 60,000.

The molecular weight of the polyvinyl butyral resin is in the range of 20,000 to 150,000. This enables the polyvinyl butyral resin to easily have a glass-transition temperature of 100° C. or higher. Furthermore, the molecular weight of the polyvinyl butyral resin is in the range of 10,000 to 60,000. This enables the polyvinyl butyral resin to easily have a glass-transition temperature of 90° C. or lower. According to this configuration, it is thus possible to easily provide the anisotropic conductive film containing the polyvinyl butyral resin having a glass-transition temperature of 100° C. or higher and the polyvinyl butyral resin having a glass-transition temperature of 90° C. or lower.

In the anisotropic conductive film according to the present invention, a cured material composed of the anisotropic conductive film preferably has a glass-transition temperature of 100° C. or higher, the glass-transition temperature being measured by dynamic viscoelasticity measurement (dynamic mechanical analysis (DMA)).

According to this configuration, the cured material composed of the anisotropic conductive film has a glass-transition temperature of 100° C. or higher, the glass-transition temperature being measured by dynamic viscoelasticity measurement (dynamic mechanical analysis (DMA)), thus effectively suppressing the migration of impurity ions in the adhesive agent for electrode connection and improving insulation. As a result, even if a current flows continuously between electrodes of a bonded article formed of the flexible printed wiring board and the wiring board at a temperature of lower than 100° C., it is possible to effectively suppress the occurrence of insulation failure due to the migration of metal atoms. It is thus possible to provide the adhesive agent for electrode connection that achieves a good balance between insulation and repairability without the occurrence of insulation failure due to the addition of polyvinyl butyral. Furthermore, for the case where the metal electrodes of the flexible printed wiring board are connected to the wiring electrodes of the wiring board by heat and pressure treatment with the anisotropic conductive film provided therebetween, it is possible to reduce the time required to cool the heated adhesive agent for electrode connection to the glass-transition temperature or lower. This makes it possible to reduce a time period for mounting by the time it takes to release pressurization.

In the anisotropic conductive film according to the present invention, preferably, in the case where the anisotropic conductive film is interposed between electrodes and cured to bond the electrodes to each other and where the electrodes are then peeled from each other, residues of the anisotropic conductive film left on release surfaces are capable of being removed with a mixed solvent having a ketone solvent content of 20% or more.

According to this configuration, the residues of the anisotropic conductive film left on release surfaces are capable of being removed with a mixed solvent having a ketone solvent content of 20% or more, thereby leading to more satisfactory repairability.

In the anisotropic conductive film according to the present invention, the electrically conductive particles preferably have an aspect ratio of 5 or more.

According to this configuration, in the case where the anisotropic conductive film is used, the contact probability between the electrically conductive particles is increased. It is thus possible to electrically connect facing electrodes without increasing the blending quantity of the electrically conductive particles.

In the anisotropic conductive film according to the present invention, the major axes of the electrically conductive particles are preferably aligned with the thickness direction of the anisotropic conductive film.

This configuration further improves the effect in which first electrodes can be electrically connected to second electrodes facing the first electrodes in one operation, each of the first electrodes being connected to a corresponding one of the second electrodes, while the insulation between adjacent electrodes is maintained to prevent a short circuit.

Advantageous Effects of Invention

According to the present invention, it is possible to provide a high-heat-resistant anisotropic conductive film which suppresses a reduction in repairability and which can be used for electrodes having a finer pitch, i.e., having a minimum pitch of 150 μm or less.

DESCRIPTION OF EMBODIMENTS

Figure 1:
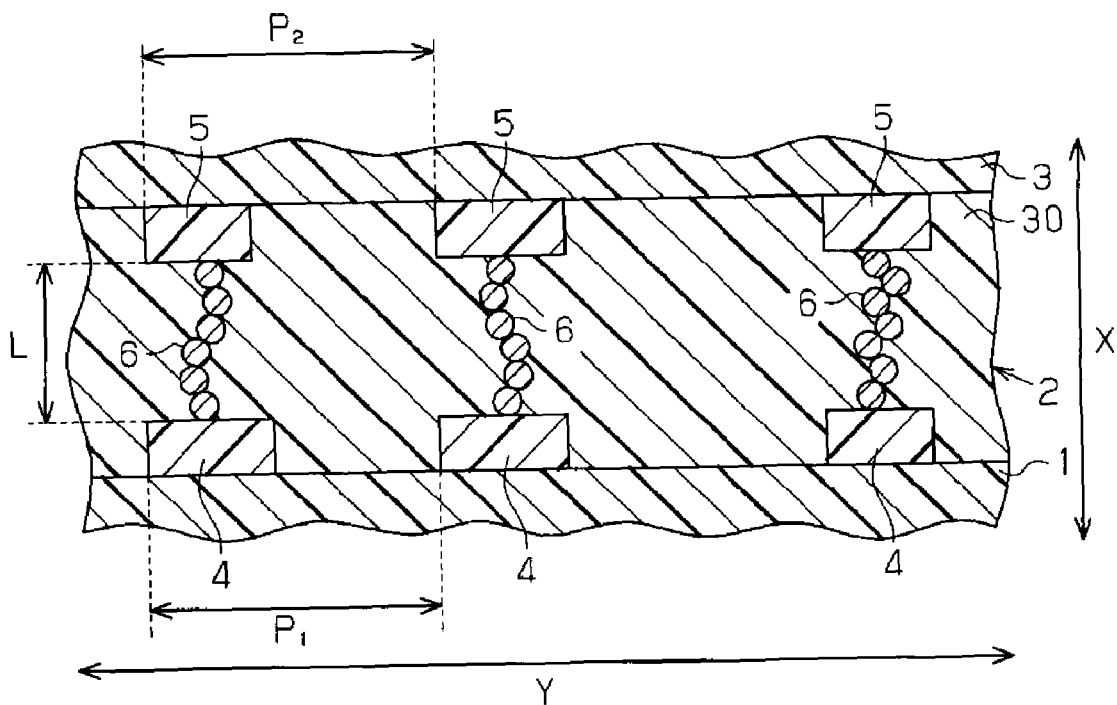
FIG. 1 is a cross-sectional view of a rigid board on which a flexible printed wiring board is mounted with an anisotropic conductive film according to an embodiment of the present invention.

Preferred embodiments of the present invention will be described below. In the description of the drawings of the present invention, the same or equivalent elements are designated using the same reference numerals, and redundant description is not repeated. The ratios of dimensions in the drawings are not always the same as those of the actual objects described in the respective drawings.

FIG. 1 is a cross-sectional view of a rigid board on which a flexible printed wiring board is mounted with an anisotropic conductive film according to this embodiment of the present invention. A method for mounting a wiring board such as a flexible printed wiring board with the anisotropic conductive film according to this embodiment includes performing heat and pressure treatment with the anisotropic conductive film containing an adhesive agent, mainly composed of a thermosetting resin, for electrode connection and electrically conductive particles contained in the adhesive agent for electrode connection to cure a thermosetting resin, thereby connecting metal electrodes of the flexible printed wiring board to wiring electrodes of the rigid board.

More specifically, as shown in FIG. 1, an anisotropic conductive film 2 containing an adhesive agent 30, mainly composed of an insulating thermosetting resin, such as an epoxy resin, for electrode connection, and electrically conductive particles 6 contained in the adhesive agent 30 for electrode connection is placed on a circuit board 1, for example, a glass board or a glass epoxy board. The anisotropic conductive film 2 is pressurized at a predetermined pressure toward the rigid board 1 with the anisotropic conductive film 2 heated at a predetermined temperature, thereby temporarily bonding the anisotropic conductive film 2 to the rigid board 1. Then the anisotropic conductive film 2 is arranged between the circuit board 1 and a flexible printed wiring board 3 by placing the flexible printed wiring board 3 on the anisotropic conductive film 2 while wiring electrodes 4 arranged on a surface of the circuit board 1 are aligned with metal electrodes 5 arranged on a surface of a flexible printed wiring board 3 with the flexible printed wiring board 3 facing downward. Next, a press head (not shown) serving as a compressing member heated to an appropriate temperature such that the anisotropic conductive film 2 reaches a predetermined temperature is arranged above the flexible printed wiring board 3. The press head is moved to the circuit board 1 to pressurize the anisotropic conductive film 2 toward the circuit board 1 at a predetermined pressure using the flexible printed wiring board 3 with the anisotropic conductive film 2 heated to a predetermined temperature, thereby melting the anisotropic conductive film 2 by heat. As described above, the anisotropic conductive film 2 is mainly composed of the thermosetting resin. Thus, heating the anisotropic conductive film 2 to the foregoing temperature allows the thermosetting resin constituting the adhesive agent 30 for electrode connection to flow, temporarily softening. The continuation of the heating results in curing. After a predetermined curing time for the anisotropic conductive film 2 has elapsed, the holding state of the curing temperature and the pressurized state of the anisotropic conductive film 2 are released, and then cooling is started. Thereby, the wiring electrodes 4 are connected to the metal electrodes 5 with the anisotropic conductive film 2, mounting the flexible printed wiring board 3 on the circuit board 1.

For example, copper electrodes coated with gold plating are used as the metal electrodes 5 of the present invention, the copper electrodes being formed by laminating metal foil such as copper foil on a surface of the flexible printed wiring board 3 and subjecting the metal foil to exposure to light, etching, and plating treatment in the usual manner. Furthermore, as the wiring electrodes 4, for example, copper electrodes coated with gold plating formed on a glass epoxy board or indium tin oxide electrodes formed on a glass board are used. Note that in this embodiment, each of the pitch P1 of the wiring electrodes 4 and the pitch P2 of the metal electrodes 5 shown in FIG. 1 is set to a fine pitch (a minimum pitch of 150 µm or less).

In this embodiment, as shown in FIG. 1, the adhesive agent 30 for electrode connection containing an epoxy resin, which is an insulating thermosetting resin, as a main component, a phenoxy resin having a molecular weight of 30,000 or more, a latent hardener, a polyvinyl butyral resin, and the electrically conductive particles 6 dispersed therein may be used as the anisotropic conductive film 2.

Here, in this embodiment, the thermosetting resin in the adhesive agent 30 for electrode connection is characterized in that the thermosetting resin contains a naphthalene-type epoxy resin and that a cured material composed of the thermosetting resin has a glass-transition temperature of 100° C. or higher, the glass-transition temperature being measured by dynamic viscoelasticity measurement (dynamic mechanical analysis (DMA)). The metal electrodes 5 of the flexible printed wiring board 3 are connected to the wiring electrodes 4 of the circuit board 1 with the anisotropic conductive film 2, effectively suppressing the migration of impurity ions in the anisotropic conductive film 2 and improving insulation. This is probably because the incorporation of the naphthalene-type epoxy resin allows the cured material composed of the thermosetting resin to have a high glass-transition temperature even when polyvinyl butyral contained in the anisotropic conductive film 2 has a low glass-transition temperature. Accordingly, the use of the anisotropic conductive film 2 containing the naphthalene-type epoxy resin and polyvinyl butyral strikes a balance between repairability and insulation. Note that the term "glass-transition temperature" described above is used to indicate a physical property value of the anisotropic conductive film 2 measured with a dynamic mechanical analyzer (DMA).

The reason the glass-transition temperature of the cured anisotropic conductive film 2 is set to 100° C. or higher is as follows: A temperature condition under which an accelerated test to check insulation is performed is set to 85° C. Thus, for the case of a glass-transition temperature of 85° C. or lower when the accelerated test is performed, insulation failure occurs because of the migration of metal atoms, disadvantageously reducing the insulation of the anisotropic conductive film 2. Hence, the glass-transition temperature is not limited to 100° C. or higher so long as the insulation is improved. The reason for the use of the naphthalene-type epoxy resin is that the resin has a rigid structure and can easily increase the glass-transition temperature.

The naphthalene-type epoxy resin of the present invention may contain a naphthalene ring and an epoxy group in its molecule. In particular, the naphthalene-type epoxy resin desirably contains two or more epoxy groups and is desirably formed by the reaction of naphthalenediol and epichlorohydrin.

Examples of the epoxy resin usable as the thermosetting resin other than the naphthalene-type epoxy resin include, but are not particularly limited to, epoxy resins from bisphenol A, F, S, and AD; copolymer-type epoxy resins from bisphenol A and bisphenol F; novolac-type epoxy resins; biphenyl-type epoxy resins; and dicyclopentadiene-type epoxy resins.

The adhesive agent 30 for electrode connection contains a phenoxy resin, which is a high-molecular-weight epoxy resin, in addition to the thermosetting resin described above. Examples of the phenoxy resin that can be used include phenoxy resins having a bisphenol-A structure, phenoxy resins having a bisphenol-F structure, and phenoxy resins each having both the bisphenol-A structure and the bisphenol-F structure. The phenoxy resin needs to have a molecular weight of 30,000 or more in view of a film-formation property. The term "molecular weight" defined herein indicates a weight-average molecular weight in terms of polystyrene determined by gel permeation chromatography using a developing solvent consisting of tetrahydrofuran.

Although the latent hardener contained in the anisotropic conductive film 2 has excellent storage stability at low temperatures and scarcely causes a hardening reaction at room temperature, the latent hardener rapidly causes the curing reaction by heat, light, or the like. Examples of the latent hardener include hardeners of amine types, such as imidazole types, boron trifluoride-amine complexes, amine imides, polyamine types, tertiary amines, and alkyl urea types, dicyandiamide types, acid anhydride types, phenol types, and modified materials thereof. These may be used separately or in combination as a mixture of two or more.

Among these latent hardeners, imidazole type latent hardeners are preferably used from the viewpoint of excellent storage stability at low temperatures and fast curing. Known imidazole type latent hardeners may be used as the imidazole type latent hardeners. More specifically, adducts of imidazole compounds and epoxy resins are exemplified. Examples of imidazole compounds include imidazole, 2-methylimidazole, 2-ethylimidazole, 2-propylimidazole, 2-dodecylimidazole, 2-phenylimidazole, 2-phenyl-4-methylimidazole, and 4-methylimidazole.

In particular, microencapsulated latent hardeners each formed by coating a corresponding one of the foregoing latent hardeners with a macromolecular substance, for example, polyurethane or polyester, or with a metallic thin film composed of nickel or copper and an inorganic substance such as calcium silicate are preferred because they are able to successfully strike a balance between long shelf life and fast curing, which are a trade-off relationship. Thus, microencapsulated imidazole type latent hardeners are particularly preferred.

For example, a compound formed by the reaction of a polyvinyl alcohol and a butyraldehyde may be used as the polyvinyl butyral resin of the present invention. The polyvinyl butyral resin needs to contain both a polyvinyl butyral resin having a glass-transition temperature of 100° C. or higher and a polyvinyl butyral resin having a glass-transition temperature of 90° C. or lower. Here, if the polyvinyl butyral resin contains only the polyvinyl butyral resin having a glass-transition temperature of 100° C. or higher, repairability is reduced. If the polyvinyl butyral resin contains only the polyvinyl butyral resin having a glass-transition temperature of 90° C. or less, heat resistance is reduced, in which case the resistance (insulation resistance) between adjacent electrodes of the anisotropic conductive film in the planar direction is reduced due to heat generated by the electrodes during power on, thereby reducing insulation performance.

In this case, the proportion of the polyvinyl butyral resin having a glass-transition temperature of 100° C. or higher is preferably in the range of 10% by mass to 90% by mass with respect to the total mass of all polyvinyl butyral resins contained. A proportion of the polyvinyl butyral resin having a glass-transition temperature of 100° C. or higher of 10% by mass or more with respect to the total mass of all polyvinyl butyral resins results in improvement in the heat resistance of the anisotropic conductive film compared with the case of less than 10% by mass, so that the film can be used for electrodes having a finer pitch, i.e., having a minimum pitch of 150 µm or less. Furthermore, a proportion of the polyvinyl butyral resin having a glass-transition temperature of 100° C. or higher of 90% by mass or less with respect to the total mass of all polyvinyl butyral resins facilitates the softening of the polyvinyl butyral resin by heating, as compared with the case of more than 90% by mass, thus maintaining repairability at a satisfactorily level.

As the polyvinyl butyral resin having a glass-transition temperature of 100° C. or higher, a polyvinyl butyral resin having a molecular weight of 20,000 to 150,000 is preferred. This is because the polyvinyl butyral resin having such a molecular weight makes it possible to easily achieve a glass-transition temperature of 100° C. or higher. Similarly, as the polyvinyl butyral resin having a glass-transition temperature of 90° C. or lower, a polyvinyl butyral resin having a molecular weight of 10,000 to 60,000 is preferred. This is because the polyvinyl butyral resin having such a molecular weight makes it possible to easily achieve a glass-transition temperature of 90° C. or lower. As such a polyvinyl butyral, for example, a compound formed by the reaction of a polyvinyl alcohol and butyraldehyde may be used.

The blending quantity of the polyvinyl butyral resin with respect to the entirety of the anisotropic conductive film is desirably in the range of 5% by mass to 35% by mass. The reason for this is as follows: If the blending quantity of the polyvinyl butyral resin is less than 5% by mass, the aforementioned repairability is not sufficiently provided, in some cases. A blending quantity exceeding 35% by mass can lead to insufficient insulation.

Figure 2:
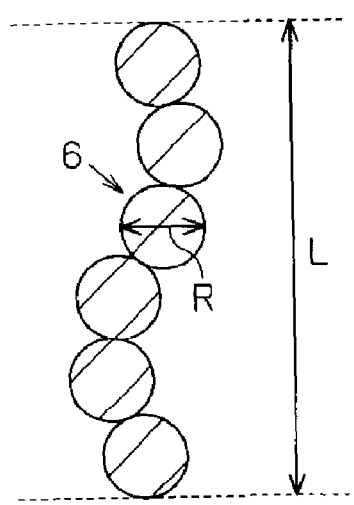
FIG. 2 is an explanatory view of electrically conductive particles for use in an anisotropic conductive film according to an embodiment of the present invention.

In this embodiment, as the anisotropic conductive film 2, for example, a mixture of the electrically conductive particles 6 dispersed in the adhesive agent 30, mainly composed of the foregoing epoxy resin, for electrode connection may be used, the electrically conductive particles 6 being composed of a high-aspect-ratio metal powder having an acicular shape or a straight-chain shape formed by connecting many fine metal particles (fine metal particles such as spherical metal particles or spherical resin particles plated with a metal). The term "aspect ratio" used herein indicates the ratio of the major axis L (the length of each of the electrically conductive particles 6) to the minor axis R of a corresponding one of electrically conductive particles 6 (the length of the cross section of the corresponding electrically conductive particles 6) as shown in FIG. 2.

Furthermore, for the anisotropic conductive film 2, the major axes L of the electrically conductive particles 6 are aligned with the thickness direction X of the adhesive agent 30 for electrode connection (or the thickness direction of the anisotropic conductive film 2) by passing the anisotropic conductive film 2 through a magnetic field applied in the thickness direction at the time of the formation of the anisotropic conductive film 2. Such an orientation makes it possible to maintain the insulation between adjacent electrodes to prevent a short circuit with respect to the planar direction of the adhesive agent 30 for electrode connection (a direction which is orthogonal to the thickness direction X, indicated by an arrow Y shown in FIG. 1, and equal to the planar direction of the anisotropic conductive film 2), and to electrically connect each of the wiring electrodes 4 to a corresponding one of the metal electrodes 5 in one operation with respect to the thickness direction X.

In this embodiment, the electrically conductive particles 6 have an aspect ratio of 5 or more. The use of such electrically conductive particles 6 increases the contact probability between the electrically conductive particles 6 when the anisotropic conductive film 2 is used. It is thus possible to electrically connect the wiring electrodes 4 to the metal electrodes 5 without increasing the blending quantity of the electrically conductive particles 6.

Preferably, the metal powder used in the present invention partially contains a ferromagnetic substance. The metal powder is preferably composed of any one of ferromagnetic elemental metals, two or more component ferromagnetic alloys, alloys of ferromagnetic metals and the other metals, and complexes containing ferromagnetic metals. This is because the use of the ferromagnetic metal permits the electrically conductive particles 6 to be aligned by the use of a magnetic field owing to the magnetism of the metal itself. Examples thereof include nickel, iron, cobalt, and two or more component alloys containing thereof.

The aspect ratio of each of the electrically conductive particles 6 is directly measured by, for example, observation with a charge-coupled device (CCD) microscope. For the case where each of the electrically conductive particles 6 has a noncircular cross section, the maximum length of the cross section is defined as the minor axis, and then the aspect ratio is determined. Each of the electrically conductive particles 6 need not necessarily have a straight shape. Even if they are slightly curved or branched, they can be used without problems. In this case, the maximum length of each of the electrically conductive particles 6 is defined as the major axis, and then the aspect ratio is determined.

The anisotropic conductive film after curing preferably has a glass-transition temperature of 100° C. or higher. A glass-transition temperature of 100° C. or higher after curing allows insulation performance to be maintained at a high level under service conditions.

Meanwhile, at the time of repair after the electrodes are connected with the anisotropic conductive film, it takes the longest time to perform an operation to remove residues of the anisotropic conductive film left on release surfaces after peeling of the electrodes. It is thus desirable to easily remove the residues. In the case where the anisotropic conductive film according to this embodiment is interposed between electrodes and cured to bond the electrodes to each other and where the electrodes are then peeled from each other, residues of the anisotropic conductive film left on release surfaces are capable of being removed with a mixed solvent having a ketone solvent content of 20% or more. Thus, the use of the mixed solvent having a ketone solvent content of 20% or more enables us to easily remove the residues of the anisotropic conductive film left on the release surfaces, leading to more satisfactory repairability.

A method for producing the anisotropic conductive film 2 is as follows: For example, an epoxy resin, which is a thermosetting resin, a phenoxy resin having a molecular weight of 30,000 or more, a microencapsulated latent hardener, a polyvinyl butyral resin having a glass-transition temperature of 100° C. or higher, and a polyvinyl butyral resin having a glass-transition temperature of 90° C. or lower are mixed in a predetermined weight ratio. The resulting mixture is dissolved or dispersed in a solvent (e.g., 2-ethoxyethyl acetate) and then mixed with a three-roll mill. After the electrically conductive particles 6 are added thereto in a predetermined proportion, the resulting mixture is agitated with a centrifugal-type agitating mixer to uniformly disperse the electrically conductive particles 6, thereby preparing a composite material used for an adhesive agent. The composite material is applied with a doctor knife onto a polyethylene terephthalate (PET) film that has been subjected to release treatment. The applied material is dried at a predetermined drying temperature (e.g., 60° C.) to become solidified in a magnetic field having a predetermined magnetic flux density, thereby providing the film.

According to this embodiment described above, the following effects can be provided.

(1) In this embodiment, the anisotropic conductive film 2 contains the polyvinyl butyral resin having a glass-transition temperature of 90° C. or lower, easily softening the polyvinyl butyral resin by heat to maintain repairability at a satisfactory level. Meanwhile, the anisotropic conductive film contains the polyvinyl butyral resin having a glass-transition temperature of 100° C. or higher, improving the heat resistance of the anisotropic conductive film 2. As a result, the film can be used in the case where the pitch P1 of the wiring electrodes 4 and the pitch P2 of the metal electrodes 5 are 150 µm or less.

(2) In this embodiment, a proportion of the polyvinyl butyral resin having a glass-transition temperature of 100° C. or higher of 10% by mass or more with respect to the total mass of all polyvinyl butyral resins results in improvement in the heat resistance of the anisotropic conductive film 2 compared with the case of less than 10% by mass, so that the film can be used in the case where the pitch P1 of the wiring electrodes 4 and the pitch P2 of the metal electrodes 5 are 150 µm or less. Furthermore, a proportion of the polyvinyl butyral resin having a glass-transition temperature of 100° C. or higher of 90% by mass or less with respect to the total mass of all polyvinyl butyral resins facilitates the softening of the polyvinyl butyral resin by heat, as compared with the case of more than 90% by mass, thus maintaining repairability at a satisfactorily level.

(3) In this embodiment, the molecular weight of the polyvinyl butyral resin is in the range of 20,000 to 150,000. This enables the polyvinyl butyral resin to easily have a glass-transition temperature of 100° C. or higher. Furthermore, the molecular weight of the polyvinyl butyral resin is in the range of 10,000 to 60,000. This enables the polyvinyl butyral resin to easily have a glass-transition temperature of 90° C. or lower. According to this configuration, it is thus possible to easily provide the anisotropic conductive film containing the polyvinyl butyral resin having a glass-transition temperature of 100° C. or higher and the polyvinyl butyral resin having a glass-transition temperature of 90° C. or lower.

(4) In this embodiment, the cured material composed of the anisotropic conductive film 2 has a glass-transition temperature of 100° C. or higher, the glass-transition temperature being measured by dynamic viscoelasticity measurement (dynamic mechanical analysis (DMA)), thus effectively suppressing the migration of impurity ions in the adhesive agent 30 for electrode connection and improving insulation. As a result, even if a current flows continuously between electrodes of a bonded article formed of the flexible printed wiring board 3 and the rigid board 1 at a temperature of lower than 100° C., it is possible to effectively suppress the occurrence of insulation failure due to the migration of metal atoms. It is thus possible to provide the anisotropic conductive film 2 that achieves a good balance between insulation and repairability without the occurrence of insulation failure due to the addition of polyvinyl butyral. Furthermore, for the case where the metal electrodes 5 of the flexible printed wiring board 3 are connected to the wiring electrodes 4 of the rigid board 1 by heat and pressure treatment with the anisotropic conductive film 2 provided therebetween, it is possible to reduce the time required to cool the heated anisotropic conductive film 2 to the glass-transition temperature or lower. This makes it possible to reduce a time period for mounting by the time it takes to release pressurization.

(5) In this embodiment, the residues of the anisotropic conductive film 2 left on release surfaces are capable of being removed with a mixed solvent having a ketone solvent content of 20% or more, thereby leading to more satisfactory repairability.

(6) In this embodiment, the electrically conductive particles 6 have an aspect ratio of 5 or more. Thus, in the case where the anisotropic conductive film 2 is used, the contact probability between the electrically conductive particles is increased. It is thus possible to electrically connect facing electrodes, i.e., the metal electrodes 5 and the wiring electrodes 4, without increasing the blending quantity of the electrically conductive particles 6.

(7) In this embodiment, the major axes of the electrically conductive particles 6 are aligned with the thickness direction x of the anisotropic conductive film 2. This further improves the effect in which each of the metal electrodes 5 can be electrically connected to a corresponding one of the wiring electrodes 4 in one operation while the insulation between adjacent electrodes, for example, between adjacent metal electrodes 5, is maintained to prevent a short circuit.

The foregoing embodiment may be modified as described below.

In the foregoing embodiment, the metal electrodes 5 of the flexible printed wiring board 3 are connected to the wiring electrodes 4 of the circuit board 1 with the anisotropic conductive film 2 provided therebetween. Alternatively, the anisotropic conductive film 2 of the present invention may be used to establish connections between projected electrodes (or bumps) of an electronic component such as an integrated circuit (IC) chip and the metal electrodes 5 of the flexible printed wiring board 3 or between projected electrodes (or bumps) of an electronic component such as an integrated circuit (IC) chip and the wiring electrodes 4 of the circuit board 1.

The present invention will be described below on the basis of examples and comparative examples. The present invention is not limited to these examples. These examples may be modified or altered on the basis of the purpose of the invention. The modifications and alterations are not excluded from the scope of the invention.

EXAMPLES 1

Preparation of Adhesive Agent

As electrically conductive particles, straight-chain nickel fine particles each having a major axis L of 1 µm to 8 µm and a minor axis R of 0.1 µm to 0.4 µm were used. As epoxy resins, (1) a naphthalene-type epoxy resin [trade name: Epicron 4032D, manufactured by Dainippon Ink and Chemicals, Incorporated] and (2) a bisphenol A-type solid epoxy resin [trade name: Epikote 1004, manufactured by Japan Epoxy Resins Co., Ltd.] were used. As a phenoxy resin, (3) phenoxy resin [trade name: Epikote 1256, manufactured by Japan Epoxy Resins Co., Ltd.] was used. As a latent hardener, (4) a microencapsulated imidazole-type hardener [trade name: Novacure HX3941, manufactured by Asahi Kasei Epoxy Co., Ltd.] was used. As a polyvinyl butyral resin having a glass-transition temperature of 100° C. or higher, (5) a polyvinyl butyral resin [trade name: S-LEC KS-1, manufactured by Sekisui Chemical Co., Ltd.] was used. As a polyvinyl butyral resin having a glass-transition temperature of 90° C. or lower, (7) a polyvinyl butyral resin S-LEC BM-1, manufactured by Sekisui Chemical Co., Ltd.] was used. These components (1) to (7) were mixed in a weight ratio of (1)20/(2)10/(3)50/(4)80/(5)10/(7)10. In this case, the proportion of the polyvinyl butyral resin (5) having a glass-transition temperature of 100° C. or higher was 50% by mass with respect to the total mass of all polyvinyl butyral resins, i.e., (5)+(7). Furthermore, the total mass of all polyvinyl butyral resins, i.e., (5)+(7), was 11.1% by mass with respect to the total mass of the entirety of the anisotropic conductive film, i.e., the sum of (1) to (7).

The epoxy resins, the phenoxy resin, the microencapsulated latent hardener, the polyvinyl butyral resin having a glass-transition temperature of 100° C. or higher, and the polyvinyl butyral resin having a glass-transition temperature of 90° C. or lower were dissolved or dispersed in 2-ethoxyethyl acetate. The resulting mixture was mixed with a three-roll mill, thereby preparing a solution having a solid content of 50% by mass. The Ni powder described above was added to the solution in such a manner that a metal-filling rate, which is indicated by the proportion of the metal in the total amount of the solid components (the Ni powder+the resins), was 0.1% by volume. Then the mixture was agitated with a centrifugal type agitating mixer to uniformly disperse the Ni powder, thereby preparing a composite material for an adhesive agent. The resulting composite material was applied with a doctor knife onto a PET film that had been subjected to release treatment. The applied composite material was dried and solidified at 60° C. for 30 minutes in a magnetic field having a magnetic flux density of 100 mT in such a manner that the major axes of the Ni particles were aligned with the thickness direction of the adhesive agent, mainly composed of the epoxy resins, for electrode connection, thereby forming a 35 μm-thick anisotropic conductive film in which straight-chain particles in the film were aligned with the direction of the magnetic field.

(Measurement of Glass-Transition Temperature)

A dynamic viscoelasticity analyzer (EXSTAR6000 DMS, manufactured by SII NanoTechnology Inc.) was used. The glass-transition temperature of a cured material composed of the resulting anisotropic conductive film was measured by dynamic viscoelasticity measurement (dynamic mechanical analysis (DMA)) at a heating rate of 10° C. per minute, a frequency of 1 Hz, and a load of 5 g. Note that a cured material sample having a width of 2 mm and a length of 10 mm was used. Table shows the results.

(Evaluation of Repairability)

A flexible printed wiring board in which 100 gold-plated copper electrodes each having a width of 75 μm and a height of 18 μm were spaced at 75 μm (that is, the copper electrodes were arranged at a pitch of 150 μm) and a rigid board (glass-cloth epoxy board) in which 100 gold-plated copper electrodes each having a width of 75 μm and a height of 18 μm were spaced at 75 μm (that is, the copper electrodes were arranged at a pitch of 150 μm) were provided. Then the resulting anisotropic conductive film was sandwiched between the flexible printed wiring board and the glass epoxy board. They were press-bonded at a pressure of 4 MPa for 15 seconds while being heated at 200° C., providing a bonded article of the flexible printed wiring board and the glass epoxy board. Next, the flexible printed wiring board was peeled from the glass epoxy board while the bonded article was heated at 200° C. Residues of the anisotropic conductive film left on release surface, i.e., on the copper electrodes, of the glass epoxy board were removed by wiping with a cotton swab that was dipped into a mixed solvent of methyl ethyl ketone and ethanol (mixing ratio=70/30). The time it took to remove the residues of the anisotropic conductive film left on the copper electrodes of the glass epoxy board was measured and evaluated as a repair time. At this time, in the case where the treatment performed for 10 minutes or more failed to complete the removal of the residues of the anisotropic conductive film, repairability was determined to be insufficient, and the repairability evaluation test was terminated. This evaluation was repeated 10 times, and a mean repair time was determined. Table shows the results.

(Evaluation of Heat Resistance)

The evaluation of heat resistance was performed as follows: The foregoing bonded article (before peeling the flexible printed wiring board from the glass epoxy board) was prepared. ADC voltage of 15 V was continuously applied between 10 pairs of adjacent electrodes in a constant-temperature and constant-humidity tank set to a temperature of 85° C. and a humidity of 85%. Insulation resistance values determined from currents passing therethrough were measured with the lapse of time. The insulation was determined to be broken at the time the insulation resistance reached 1 MΩ or less. The time from the initiation of voltage application to dielectric breakdown was measured. The result was used as the evaluation of heat resistance. In the evaluation, for the case where the insulation was not broken even after more than 500 hours, the heat resistance was determined to be satisfactory, and the insulation evaluation was terminated. Table shows the results.

EXAMPLE 2

An anisotropic conductive film was produced as in Example 1, except that (6) a polyvinyl butyral resin [trade name: S-LEC KS-3, manufactured by Sekisui Chemical Co., Ltd.] was used as the polyvinyl butyral resin having a glass-transition temperature of 100° C. or higher and that the components (1) to (7) were mixed in a weight ratio of (1)20/(2)10/(3)50/(4)80/(6)10/(7)10. Then a bonded article of the flexible printed wiring board and the rigid board was formed. In this case, the proportion of the polyvinyl butyral resin (6) having a glass-transition temperature of 100° C. or higher was 50% by mass with respect to the total mass of all polyvinyl butyral resins, i.e., (6)+(7). Furthermore, the total mass of all polyvinyl butyral resins, i.e., (6)+(7), was 11.1% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

EXAMPLE 3

An anisotropic conductive film was produced as in Example 1, except that (6) a polyvinyl butyral resin [trade name: S-LEC KS-3, manufactured by Sekisui Chemical Co., Ltd.] was used as the polyvinyl butyral resin having a glass-transition temperature of 100° C. or higher and that the components (1) to (7) were mixed in a weight ratio of (1)20/(2)10/(3)60/(4)80/(6)5/(7)5. Then a bonded article of the flexible printed wiring board and the rigid board was formed. In this case, the proportion of the polyvinyl butyral resin (6) having a glass-transition temperature of 100° C. or higher was 50% by mass with respect to the total mass of all polyvinyl butyral resins, i.e., (6)+(7). Furthermore, the total mass of all polyvinyl butyral resins, i.e., (6)+(7), was 5.6% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

EXAMPLE 4

An anisotropic conductive film was produced as in Example 1, except that (6) a polyvinyl butyral resin [trade name: S-LEC KS-3, manufactured by Sekisui Chemical Co., Ltd.] was used as the polyvinyl butyral resin having a glass-transition temperature of 100° C. or higher and that the components (1) to (7) were mixed in a weight ratio of (1)20/(2)10/(3)30/(4)80/(6)20/(7)20. Then a bonded article of the flexible printed wiring board and the rigid board was formed. In this case, the proportion of the polyvinyl butyral resin (6) having a glass-transition temperature of 100° C. or higher was 50% by mass with respect to the total mass of all polyvinyl butyral resins, i.e., (6)+(7). Furthermore, the total mass of all polyvinyl butyral resins, i.e., (6)+(7), was 22.2% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

EXAMPLE 5

An anisotropic conductive film was produced as in Example 1, except that (6) a polyvinyl butyral resin [trade name: S-LEC KS-3, manufactured by Sekisui Chemical Co., Ltd.] was used as the polyvinyl butyral resin having a glass-transition temperature of 100° C. or higher and that the components (1) to (7) were mixed in a weight ratio of (1)10/(2)5/(3)25/(4)80/(6)30/(7)30. Then a bonded article of the flexible printed wiring board and the rigid board was formed. In this case, the proportion of the polyvinyl butyral resin (6) having a glass-transition temperature of 100° C. or higher was 50% by mass with respect to the total mass of all polyvinyl butyral resins, i.e., (6)+(7). Furthermore, the total mass of all polyvinyl butyral resins, i.e., (6)+(7), was 33.3% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

EXAMPLE 6

An anisotropic conductive film was produced as in Example 1, except that (6) a polyvinyl butyral resin [trade name: S-LEC KS-3, manufactured by Sekisui Chemical Co., Ltd.] was used as the polyvinyl butyral resin having a glass-transition temperature of 100° C. or higher and that the components (1) to (7) were mixed in a weight ratio of (1)20/(2)10/(3)50/(4)80/(6)18/(7)2. Then a bonded article of the flexible printed wiring board and the rigid board was formed. In this case, the proportion of the polyvinyl butyral resin (6) having a glass-transition temperature of 100° C. or higher was 90% by mass with respect to the total mass of all polyvinyl butyral resins, i.e., (6)+(7). Furthermore, the total mass of all polyvinyl butyral resins, i.e., (6)+(7), was 11.1% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

EXAMPLE 7

An anisotropic conductive film was produced as in Example 1, except that (6) a polyvinyl butyral resin [trade name: S-LEC KS-3, manufactured by Sekisui Chemical Co., Ltd.] was used as the polyvinyl butyral resin having a glass-transition temperature of 100° C. or higher and that the components (1) to (7) were mixed in a weight ratio of (1)20/(2)10/(3)50/(4)80/(6)4/(7)16. Then a bonded article of the flexible printed wiring board and the rigid board was formed. In this case, the proportion of the polyvinyl butyral resin (6) having a glass-transition temperature of 100° C. or higher was 20% by mass with respect to the total mass of all polyvinyl butyral resins, i.e., (6)+(7). Furthermore, the total mass of all polyvinyl butyral resins, i.e., (6)+(7), was 11.1% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

COMPARATIVE EXAMPLE 1

An anisotropic conductive film was produced as in Example 1, except that the polyvinyl butyral resin having a glass-transition temperature of 100° C. or higher was not used and that the components (1) to (7) were mixed in a weight ratio of (1)20/(2)10/(3)50/(4)80/(7)20. Then a bonded article of the flexible printed wiring board and the rigid board was formed. The total mass of the polyvinyl butyral resin, i.e., (7), was 11.1% by mass with respect to the total mass of the entirety of the anisotropic conductive film, i.e., the sum of (1) to (7). Then the measurement of a glass-transition temperature, the evaluation of repairability, and the evaluation of insulation were performed under conditions identical to those in Example 1 described above. Table shows the results.

COMPARATIVE EXAMPLE 2

An anisotropic conductive film was produced as in Example 1, except that the polyvinyl butyral resins were not used and that the components (1) to (4) were mixed in a weight ratio of (1)20/(2)10/(3)80/(4)80. Then a bonded article of the flexible printed wiring board and the rigid board was formed. Next, the measurement of a glass-transition temperature, the evaluation of repairability, and the evaluation of insulation were performed under conditions identical to those in Example 1 described above. Table shows the results.

TABLE

| | | Blending quantity (part by weight) | | | | | |
|---|---|---|---|---|---|---|---|
| | | (1) Naphthalene-type epoxy resin | (2) Bisphenol A-type solid epoxy resin | (3) Phenoxy resin | (4) Latent hardener *1 | (5) Tg ≥ 100° C. Polyvinyl butyral resin | (6) Tg ≥ 100° C. Polyvinyl butyral resin | (7) Tg ≤ 90° C. Polyvinyl butyral resin |
| Molecular weight *2 | | 270 | 1600 | 50000 | | 27000 | 108000 | 40000 |
| Tg | | | | | | 107° C. | 110° C. | 67° C. |
| Example 1 | | 20 | 10 | 50 | 80 | 10 | | 10 |
| Example 2 | | 20 | 10 | 50 | 80 | | 10 | 10 |
| Example 3 | | 20 | 10 | 60 | 80 | | 5 | 5 |

TABLE-continued

| | | | | | | |
|---|---|---|---|---|---|---|
| Example 4 | 20 | 10 | 30 | 80 | 20 | 20 |
| Example 5 | 10 | 5 | 25 | 80 | 30 | 30 |
| Example 6 | 20 | 10 | 50 | 80 | 18 | 2 |
| Example 7 | 20 | 10 | 50 | 80 | 4 | 16 |
| Comparative Example 1 | 20 | 10 | 50 | 80 | | 20 |
| Comparative Example 2 | 20 | 10 | 80 | 80 | | |

| | Content (wt %) | | | | |
|---|---|---|---|---|---|
| | Polyvinyl butyral resin/total weight of anisotropic conductive film | (5) + (6)/ (5) + (6) + (7) | Glass-transition temperature | Evaluation of repairability Repair time | Evaluation of heat resistance Insulation break-down time (hr) |
| Molecular weight *2 Tg | | | | | |
| Example 1 | 11.1 | 50 | 122° C. | 4 minutes | 500 hr or more |
| Example 2 | 11.1 | 50 | 124° C. | 4 minutes | 500 hr or more |
| Example 3 | 5.6 | 50 | 129° C. | 6 minutes | 500 hr or more |
| Example 4 | 22.2 | 50 | 117° C. | 2 minutes | 500 hr or more |
| Example 5 | 33.3 | 50 | 108° C. | 1 minute | 500 hr or more |
| Example 6 | 11.1 | 90 | 128° C. | 5 minutes | 500 hr or more |
| Example 7 | 11.1 | 20 | 118° C. | 3 minutes | 500 hr or more |
| Comparative Example 1 | 11.1 | 0 | 110° C. | 3 minutes | 270 (X) |
| Comparative Example 2 | 0.0 | — | 122° C. | 10 minutes or more (X) | 500 hr or more |

*1 (4) The latent hardener contains 13% epoxy with a molecular weight of 380 and 52% epoxy with a molecular weight of 350.
*2 Each of the molecular weights is a mean molecular weight.

As shown in Table, in each of Examples 1 to 7, in which the polyvinyl butyral resin having a glass-transition temperature of 100° C. or higher, i.e., (5) or (6), and the polyvinyl butyral resin (7) having a glass-transition temperature of 90° C. or lower are contained, reference values are met in both the evaluation of repairability and the evaluation of insulation. Thus, the anisotropic conductive film containing the thermosetting resins, the phenoxy resin, the latent hardener, the polyvinyl butyral resin having a glass-transition temperature of 100° C. or higher, the polyvinyl butyral resin having a glass-transition temperature of 90° C. or lower, and the electrically conductive particles is a high-heat-resistant anisotropic conductive film which suppresses a reduction in repairability and which can be used for electrodes having a finer pitch, i.e., having a minimum pitch of 150 μm or less. In contrast, in Comparative Example 2, in which none of the polyvinyl butyral resins are contained, the results demonstrate that heat resistance is large, but repairability is not maintained. In Comparative Example 1, in which the polyvinyl butyral resin (7) having a glass-transition temperature of 90° C. or lower is contained but the polyvinyl butyral resin having a glass-transition temperature of 100° C. or higher is not contained, the results demonstrate that the heat resistance is not sufficient.

The proportions of the polyvinyl butyral resin (5) or (6) having a glass-transition temperature of 100° C. or higher are 20% by mass in Example 7, 50% by mass in each of Examples 1 to 5, and 90% by mass in Example 6. The results demonstrate that the anisotropic conductive films each having a proportion of the polyvinyl butyral resin with a glass-transition temperature of 100° C. or higher of 10% by mass to 90% by mass with respect to the total mass of all polyvinyl butyral resins are each an anisotropic conductive film which suppresses a reduction in repairability and which has high heat resistance.

Furthermore, in Examples 1 to 7, a lower polyvinyl butyral resin content with respect to the total mass of the anisotropic conductive film results in a higher glass-transition temperature and a longer repair time. In contrast, a higher polyvinyl butyral resin content with respect to the total mass of the anisotropic conductive film results in a lower glass-transition temperature and a shorter repair time. From the results, it is speculated that a higher polyvinyl butyral resin content results in improvement in repairability but results in a lower glass-transition temperature, thereby reducing the heat resistance. From Examples 1 to 7, it is speculated that in the case where the total proportion of the polyvinyl butyral resins is in the range of 5% by mass to 35% by mass with respect to the total mass of the anisotropic conductive film, a good balance between the repairability and the heat resistance is preferably achieved.

A comparison of Example 1 and Example 2 shows that for the case of using the polyvinyl butyral resins each having a glass-transition temperature of 100° C. or higher, the same effect is provided in both cases where the resin has a molecular weight of 27,000 and the resin has a molecular weight of 108,000. It is thus speculated that for the case where the polyvinyl butyral resin with a glass-transition temperature of 100° C. or higher has a molecular weight of 20,000 to 150,000, the same effect is provided regardless of the molecular weight. Furthermore, the polyvinyl butyral resin with a glass-transition temperature of 90° C. or lower has a molecular weight of 40,000. It is thus speculated that for the case where the polyvinyl butyral resin with a glass-transition temperature of 90° C. or lower has a molecular weight of 10,000 to 60,000, the same effect is provided.

In each of Examples 1 to 7, the cured material composed of the anisotropic conductive film has a glass-transition temperature of 100° C. or higher. In this range, the heat resistance is satisfactory. In the case where electrodes having a finer pitch, i.e., having a minimum pitch of 150 μm or less, are connected with the anisotropic conductive film, the temperature can reach 90° C. or higher during power on. In view of this, probably, the cured material composed of the anisotropic conductive film preferably has a glass-transition temperature of 100° C. or higher.

It should be understood that the embodiment and examples disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention relates to an anisotropic conductive film configured to bond and electrically connect a wiring board or an electronic component provided with an electrode, a circuit, and so forth and thus is widely used in industry.

REFERENCE SIGNS LIST

| | |
|---|---|
| 1 | rigid board |
| 2 | anisotropic conductive film |
| 3 | flexible printed wiring board |
| 4 | wiring electrode |
| 5 | metal electrode |
| 6 | electrically conductive particle |
| 30 | adhesive agent for electrode connection |
| L | major axis of electrically conductive particle |
| R | minor axis of electrically conductive particle |
| T | thickness of resin layer |
| X | thickness direction of anisotropic conductive film |
| Y | planar direction of anisotropic conductive film |

CITATION LIST

Patent Literature

PTL 1: Japanese Unexamined Patent Application Publication No. 5-117419

The invention claimed is:

1. An anisotropic conductive film comprising a thermosetting resin as a main component, a phenoxy resin having a molecular weight of 30,000 or more, a latent hardener, a polyvinyl butyral resin, and electrically conductive particles,
wherein the polyvinyl butyral resin contains a polyvinyl butyral resin having a glass-transition temperature of 100° C. or higher and a polyvinyl butyral resin having a glass-transition temperature of 90° C. or lower.

2. The anisotropic conductive film according to claim 1, wherein the proportion of the polyvinyl butyral resin having a glass-transition temperature of 100° C. or higher is in the range of 10% by mass to 90% by mass with respect to the total mass of all polyvinyl butyral resins contained.

3. The anisotropic conductive film according to claim 1, wherein the total proportion of the polyvinyl butyral resins is in the range of 5% by mass to 35% by mass with respect to the total mass of the anisotropic conductive film.

4. The anisotropic conductive film according to claim 1, wherein the polyvinyl butyral resin with a glass-transition temperature of 100° C. or higher has a molecular weight of 20,000 to 150,000, and the polyvinyl butyral resin with a glass-transition temperature of 90° C. or lower has a molecular weight of 10,000 to 60,000.

5. The anisotropic conductive film according to claim 1, wherein a cured material composed of the anisotropic conductive film has a glass-transition temperature of 100° C. or higher, the glass-transition temperature being measured by dynamic viscoelasticity measurement (dynamic mechanical analysis (DMA)).

6. The anisotropic conductive film according to claim 1, wherein in the case where the anisotropic conductive film is interposed between electrodes and cured to bond the electrodes to each other and where the electrodes are then peeled from each other, residues of the anisotropic conductive film left on release surfaces are capable of being removed with a mixed solvent having a ketone solvent content of 20% or more.

7. The anisotropic conductive film according to claim 1, wherein the electrically conductive particles have an aspect ratio of 5 or more.

8. The anisotropic conductive film according to claim 7, wherein the major axes of the electrically conductive particles are aligned with the thickness direction of the anisotropic conductive film.

* * * * *